(12) United States Patent
Maneira

(10) Patent No.: US 11,433,690 B2
(45) Date of Patent: Sep. 6, 2022

(54) METHOD OF MAKING A FILM NEGATIVE

(71) Applicant: MacDermid Graphics Solutions, LLC, Waterbury, CT (US)

(72) Inventor: John Maneira, Alpharetta, GA (US)

(73) Assignee: MacDermid Graphics Solutions, LLC, Waterbury, CT (US)

( * ) Notice: Subject to any disclaimer, the term of this patent is extended or adjusted under 35 U.S.C. 154(b) by 15 days.

(21) Appl. No.: 17/307,305

(22) Filed: May 4, 2021

(65) Prior Publication Data

US 2021/0339542 A1 Nov. 4, 2021

Related U.S. Application Data

(60) Provisional application No. 63/019,627, filed on May 4, 2020.

(51) Int. Cl.
*B41J 11/00* (2006.01)

(52) U.S. Cl.
CPC .............. *B41J 11/00214* (2021.01)

(58) Field of Classification Search
CPC ... B41J 11/00214; G03F 7/2014; G03F 7/203; G03F 7/2032; B41M 5/0047; B41M 7/0081
See application file for complete search history.

(56) References Cited

U.S. PATENT DOCUMENTS

| | | | |
|---|---|---|---|
| 3,597,080 A | 8/1971 | Gush et al. | |
| 5,213,949 A | 5/1993 | Kojima et al. | |
| 5,813,342 A | 12/1998 | Strong | |
| 6,312,123 B1 | 11/2001 | Codos et al. | |
| 9,703,201 B2 | 7/2017 | Vest et al. | |
| 9,726,971 B2 | 8/2017 | Maneira | |
| 2008/0107908 A1 | 5/2008 | Long et al. | |
| 2012/0082932 A1* | 4/2012 | Battisti | G03F 1/68 430/306 |
| 2015/0097889 A1 | 4/2015 | Maneira | |
| 2020/0369927 A1 | 11/2020 | Saygili et al. | |

FOREIGN PATENT DOCUMENTS

WO 2019141792 7/2019

OTHER PUBLICATIONS

"Photoinitiator," Wikipedia, 2009, [retrieved from the Internet on Jun. 30, 2021 at https://en.wikipedia.org/wiki/Photoinitiator].

* cited by examiner

*Primary Examiner* — Bradley W Thies
(74) *Attorney, Agent, or Firm* — Carmody Torrance Sandak & Hennessey LLP

(57) ABSTRACT

A method of preparing a film negative including the steps of dispersing a UV ink in a desired pattern on a UV printing substrate; and curing the UV ink with a source of actinic radiation to crosslink and cure the UV ink and create the UV printed polymer layer in the desired pattern. The UV ink is at least substantially solvent-free and printing substrate does not contain an adhesive layer or an ink-receptive layer and is not been modified to be ink-receptive. The film negative may be used in a process of making a flexographic printing element.

15 Claims, 4 Drawing Sheets

METHOD OF MAKING A FILM NEGATIVE

FIELD OF INVENTION

The present invention relates generally to an improved photopolymer platemaking process.

BACKGROUND OF THE INVENTION

Flexography is a method of printing that is commonly used for high-volume runs. Flexographic printing plates are employed for printing on a variety of substrates such as paper, paperboard stock, corrugated board, films, foils and laminates. Newspapers and grocery bags are prominent examples. Coarse surfaces and stretch films can be economically printed only by means of flexography.

Flexographic printing elements generally comprise a support layer, one or more photosensitive layers, an optional slip film release layer, and an optional protective cover sheet. The protective cover sheet is formed from plastic or any other removable material that can protect the plate or photocurable element from damage until it is ready for use. If used, the slip film release layer may be disposed between the protective cover sheet and the photocurable layer(s) to protect the plate from contamination, increase ease of handling, and act as an ink-accepting layer. After exposure and development, the photopolymer flexographic printing plate consists of various image elements supported by a floor layer and anchored to a backing substrate.

It is highly desirable that flexographic printing elements work well under a wide range of conditions. Thus, the printing elements should be able to impart their relief image to a wide range of substrates, including cardboard, coated paper, newspaper, calendared paper, and polymeric films such as polypropylene. Importantly, the image should be transferred quickly and with fidelity, for as many prints as the printer desires to make.

Flexographic relief image printing elements can be manufactured in various ways including imaging and exposing of solid photocurable or photopolymerizable layers (i.e., sheet polymers) and by the processing of liquid photopolymer resins. Flexographic printing elements made from liquid photopolymer resins have the advantage that uncured resin can be reclaimed from the non-image areas of the printing elements and used to make additional printing plates. Liquid photopolymer resins have a further advantage as compared to sheet polymer in terms of flexibility, which enables the production of any required plate gauge simply by changing the machine settings.

Relief images for flexographic printing can be created using a negative of an image to mask non-image areas on photosensitive or photocurable layers. Image areas of the photosensitive or photocurable layers can be cured by cross-linking under exposure to ultraviolet (UV) light.

Flexographic printing plates may be imaged digitally (also known as computer-to-plate or CTP) or by an analog process of exposing and developing traditional films that are processed into negatives via an image setter.

Negatives can also be made using an inkjet printer to print a UV-blocking ink onto a clear plastic (e.g., polyester) material. The surface of the plastic material must be inkjet-receptive or made to be inkjet-receptive. That is, the surface must be able to create an acceptably stable and detailed image, i.e., one that adheres to the plastic and dries quickly, without migrating. The plastic material may be made inkjet-receptive by coating it with an inkjet-receptive coating, e.g., a micro-porous coating or a coating of inkjet-receptive polymer, or the material may be treated in some other manner such as acid etching, etc. to produce a surface that allows the ink to adhere to the film and dry quickly without migrating. The use of inkjet-receptive plastic materials is disclosed, for example, in U.S. Pat. No. 9,726,971 to Maneira, the subject matter of which is herein incorporated by reference in its entirety.

Various processes have been developed for producing printing plates from liquid photopolymer resins as described, for example, in U.S. Pat. No. 5,213,949 to Kojima et al., U.S. Pat. No. 5,813,342 to Strong et al., U.S. Pat. Pub. No. 2008/0107908 to Long et al., and U.S. Pat. No. 3,597,080 to Gush, the subject matter of each of which is herein incorporated by reference in its entirety.

Typical steps in the liquid platemaking process include:
(1) casting and exposure;
(2) reclamation;
(3) washout;
(4) post exposure;
(5) drying; and
(6) detackification.

In the casting and exposure step, a photographic negative is placed on a bottom glass platen and a cover film is placed over the negative in an exposure unit. The exposure unit generally comprises the bottom glass platen with a source of UV light below it (lower light) and a lid having flat top glass platen with a source of UV light above it (upper light).

Precise reproduction of the negative image detail onto the photopolymer requires that the negative be placed as close to the photopolymer layer as possible. All of the air is removed by vacuum so that any wrinkling of the negative and/or cover film can be eliminated. In addition, the bottom glass platen may be grooved to further facilitate removal of any air between the cover film and the negative. Thereafter, a layer of liquid photopolymer and a backing sheet (i.e., a thin layer of polyester or polyethylene terephthalate) are cast on top of the cover film and negative to a predetermined thickness. A backing sheet, which may be coated on one side to bond with the liquid photopolymer, is laminated over the cast liquid photopolymer layer to serve as the back of the plate after exposure.

Upper and/or lower sources of actinic radiation (i.e., upper and lower lights) are used to expose the photopolymer to actinic radiation to selectively crosslink and cure the liquid photopolymer layer in the areas not covered by the negative. The top sources of actinic radiation are used to create the floor layer of the printing plate (i.e., back exposure) while the bottom sources of actinic radiation are used to expose the photopolymer to actinic radiation through the negative to create the relief image (i.e., face exposure). Plate gauge may be adjusted and/or set by positioning a top exposure glass at a desired distance from a bottom exposure glass after dispensing liquid photopolymer on the protected bottom exposure glass.

The upper light source is turned on for a prescribed amount of time to cause the photopolymer adjacent to the substrate to crosslink uniformly over the entire surface of the plate, forming the floor. Thereafter, areas to be imaged are exposed to actinic radiation from the lower light source (i.e., through the bottom glass platen). The actinic radiation shines through the clear areas of the negative, which causes the photopolymer to crosslink in those areas, forming the relief image that bonds to the floor layer. Liquid photopolymer not exposed to the lower light source (i.e., the uncured photopolymer) remains in a liquid state and can be reclaimed and reused.

The type of radiation used is dependent in part on the type of photoinitiator in the photopolymerizable layer. The digitally-imaged mask or photographic negative prevents the material beneath from being exposed to the actinic radiation and thus those areas covered by the mask do not polymerize, while the areas not covered by the mask are exposed to actinic radiation and polymerize. Any conventional sources of actinic radiation can be used for this exposure step, which include, for example, visible and UV sources such as carbon arc lamps, mercury-vapor arc lamps, fluorescent lamps, electron flash units, electron beam units, photographic flood lamps, and light emitting diodes (LEDs), among others and in which the wavelength of emitted light depends in part on the specific type of photoinitiator.

After the exposure is complete, the printing plate is removed from the exposure unit and the photopolymer that was not exposed to actinic radiation (i.e., the photopolymer covered by the negative) remains liquid and can be reclaimed for further use. In liquid platemaking, resin recovery is an important factor relating to the production of photopolymerizable resin printing plates, and in all areas not exposed to UV radiation, the resin remains liquid after exposure and can be reclaimed. In a typical process, uncured resin is physically removed in a "reclamation" step, that typically involves squeegeeing, vacuuming or otherwise removing liquid photopolymer remaining on the surface of the printing plate. The use of a reclamation step not only saves material costs of the photopolymer resin, but also reduces the use and cost of developing chemistry and makes a lighter plate that is safer and easier to handle.

Residual traces of liquid resin remaining after the reclamation step may then be removed by nozzle or brush washing using a wash-out solution to obtain a washed-out plate, leaving behind the cured relief image. Typically, the plate is placed into a washout unit where an aqueous solution comprising soap and/or detergent is used to wash away any residual unexposed photopolymer. The plate is then rinsed with water to remove any residual solution.

Cured regions of the printing element are insoluble in the washout (or development) solution, and so after washout, a relief image formed of cured photopolymerizable resin is obtained. The cured resin is likewise insoluble in certain inks, and thus may be used in flexographic printing.

Thereafter, the printing plate is subjected to various post exposure and detackification steps. Post exposure may involve submerging the plate in a water and salt solution and performing an additional exposure of the printing plate to actinic radiation (UV light) to fully cure the printing plate and to increase plate strength. The detackification step (if used) may involve the use of a germicidal unit (i.e., light finisher) to ensure a totally tack-free plate surface. This step is not required for all plates, as certain resins may be tack-free, and thus printing press ready, without the need for the detackification step. The printing plate may then be rinsed and dried.

Typically, the floor area of a flexographic printing element prepared from a liquid photopolymer accounts for at least about half of the plate thickness, with the remainder of the plate thickness comprising the relief area. The floor provides dimensional stability to the plate and supports the relief area.

A variation on this process minimizes the floor area and significantly increases the amount of liquid photopolymer that may be reclaimed to reduce the amount of photopolymer used up in making a floor that would cover the entire sheet. These printing plates are commonly referred to as "imposition plates," "island plates," or "I-plates."

I-plates add another step to the liquid platemaking process. That is, instead of making a floor that that extends over the entire plate, a second photographic negative is placed on top of the photopolymer layer. This negative (also referred to as a masking film) outlines the image areas on the negative. The plates are first exposed to the upper UV light through the masking film, causing islands of cured polymer to be formed in the photosensitive layer adjacent to the substrate. The timing and intensity of the exposure are limited to prevent the polymerization from extending all the way through the photopolymer layer from the substrate. The second lower UV exposure, from below the relief image negative, causes the cured detailed relief image to form on top of the islands thus created. This process is described, for example, in U.S. Pat. Pub. No. 2012/0082932 to Battisti et al. and U.S. Pat. No. 9,726,971 to Maneira, the subject matter of each of which is herein incorporated by reference in its entirety. The relief image negative and masking film are aligned (i.e., registered) so that each image area of the relief image negative is approximately in the middle of each clear area of the masking film.

One of the difficulties in producing I-plates is in registering the masking film with the negative during the set up process so that the islands created in the floor area will line up (i.e., register) with the desired relief image. The masking film is typically applied over the surface of the substrate and can slip, causing the masking film to mis-register. U.S. Pat. Pub. No. 2012/0082932 to Battisti et al. attempts to solve this problem by using a substrate that has been printed with a digital representation of the island image that is then adhered to the layer of liquid photopolymer. However, this requires an additional step, further lengthening the platemaking process.

U.S. Pat. No. 9,703,201 to Vest et al., the subject matter of which is herein incorporated by reference in its entirety, describes another method of producing an I-plate in which a liquid photopolymer printing blank is selectively exposed to actinic radiation to create a relief image printing plate by scanning a light bar comprising a plurality of UV LEDs across an upper surface of the liquid photopolymer printing blank through the backing sheet to cure the layer of liquid photopolymer in selected areas, creating islands of cured polymer adjacent to the backing sheet. The light bar comprises a plurality of UV LEDs arranged across the width of the light bar so that as the light bar scans over the surface of the liquid photopolymer printing blank, the surface of the liquid photopolymer printing blank may be subjected to crosslinking and curing to create cured islands therein.

One of the time consuming steps in the platemaking process is the creation of the film negative or other mask layer used therein. There remains a need in the art for an improved method of creating the film negative or other mask layer in an efficient manner, preferably for use in a liquid platemaking process.

SUMMARY OF THE INVENTION

It is an object of the present invention to provide an improved liquid photopolymer platemaking process.

It is another object of the present invention to provide an improved method of creating a film negative or other mask layer, preferably for use in a liquid platemaking processes.

It is still another object of the present invention to provide a method of creating a film negative or other mask layer that eliminates the need for an inkjet printing substrate (film base) to be inkjet-receptive or modified to be inkjet-receptive.

It is another object of the present invention to provide an improved method of creating a film negative or other mask layer that may be used in a liquid platemaking process and that exhibits surface morphology configured to improve air removal under vacuum during an imaging step of the platemaking process.

To that end, in one embodiment, the present invention relates generally to a method of producing a film negative or other mask layer using an inkjet printing method. The disclosed film negative or mask layer, which comprises a printed polymer layer, may be utilized in manufacturing of liquid flexographic printing plates. In some embodiments, a UV printed polymer layer (e.g., a UV printed polymer layer mask) with the desired UV light blocking density may be utilized in manufacturing or imaging of flexographic printing plates.

The process of producing a film negative or other mask layer using the inkjet printing method described herein produces a UV printed polymer layer that includes providing a non-absorbent, transparent surface (i.e., inkjet printing substrate) to print ink thereon. The inkjet printing substrate may be positioned in contact with a transparent support surface (e.g., glass surface) configured to allow light exposure (e.g., UV light exposure) therethrough. The glass surface may be substantially planar, and the inkjet printing substrate is positionable thereon. Air trapped between the inkjet printing substrate and the glass surface is removed to ensure a surface free of wrinkling to receive one or more UV ink(s). The UV ink may then be transferred onto the inkjet printing substrate in a desired pattern. In a preferred embodiment, the negative-forming UV ink is ejected from a UV inkjet print head. The UV printed polymer layer, based on the desired pattern, is preferably computer-generated and communicated to the UV inkjet print head.

In one embodiment, the UV inkjet printing process may be configured for use in producing mask layer to produce a reduced floor area utilized in the manufacturing of liquid flexographic printing plates, including, for example, Imposition plates, Island plates, and I-plates.

In one embodiment, the UV printed polymer layer may include surface morphology that defines one or more microchannels, which are configured, in part, to improve air removal under vacuum during the photopolymer imaging process.

The method described herein can substantially improve, among other enhancements, (i) printing device reliability; (ii) technology support; (iii) consumable costs; (iv) labor costs; (v) liquid plate making process; (vi) mask production speed; and (vii) finished product production and quality.

Notably, because the UV inks described herein do not require the removal of a volatile compound and/or water, the imaging step can be simplified. More preferably, the UV ink usable in the practice of the instant invention is at least substantially solvent-free.

The disclosed method is capable of producing an image negative in about 15 minutes or less, as compared to traditional production times that typically require at least about 60 minutes.

BRIEF DESCRIPTION OF FIGURES

Features and aspects of embodiments of the instant invention are described below with reference to the accompanying drawings, in which elements are not necessarily depicted to scale.

Exemplary embodiments of the present disclosure are further described with reference to the following figures. It is to be noted that the various features, steps and combinations of features/steps described below and illustrated in the figures can be arranged and organized differently to result in embodiments which are still within the scope of the present disclosure.

Figure 1:
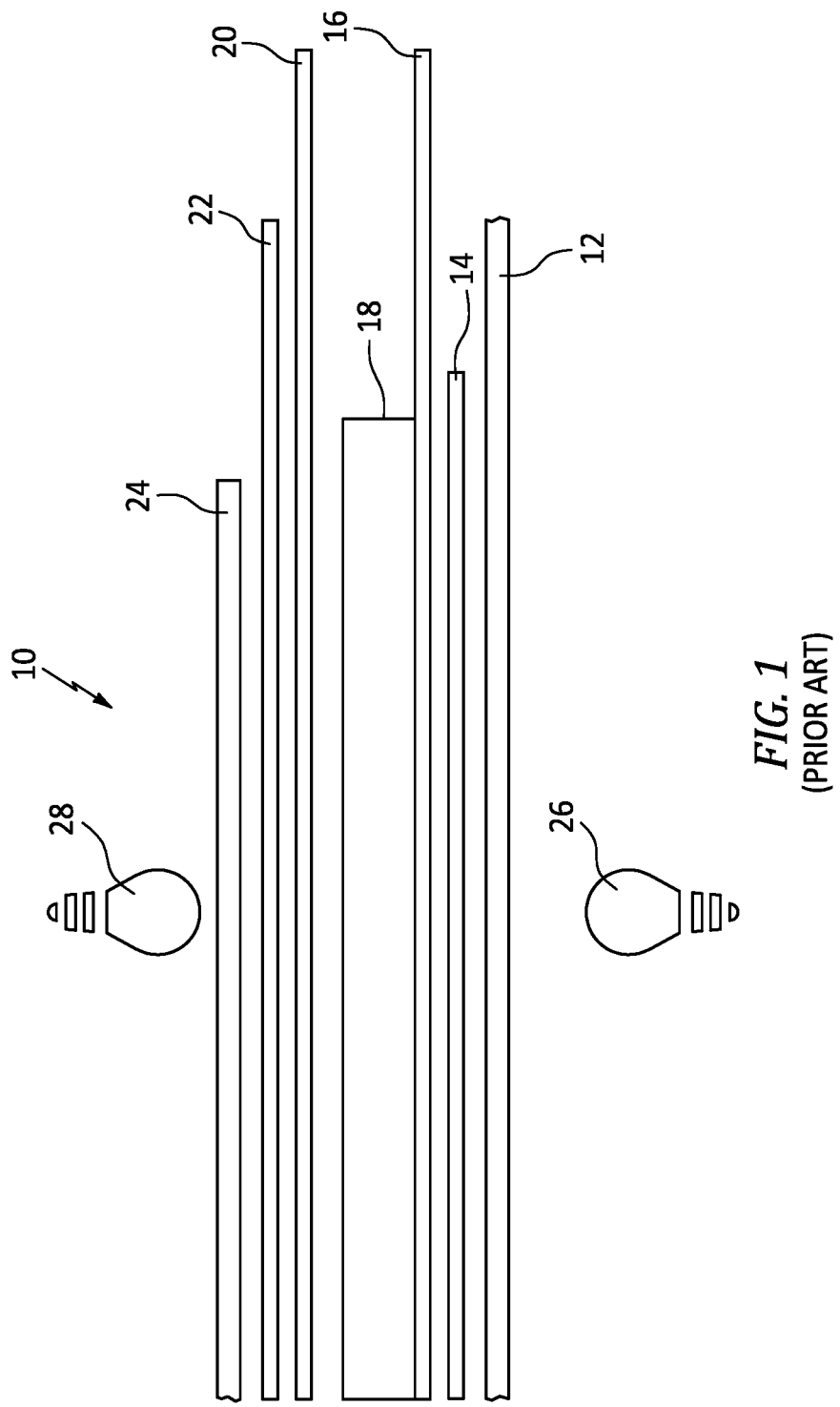
Figure 2:
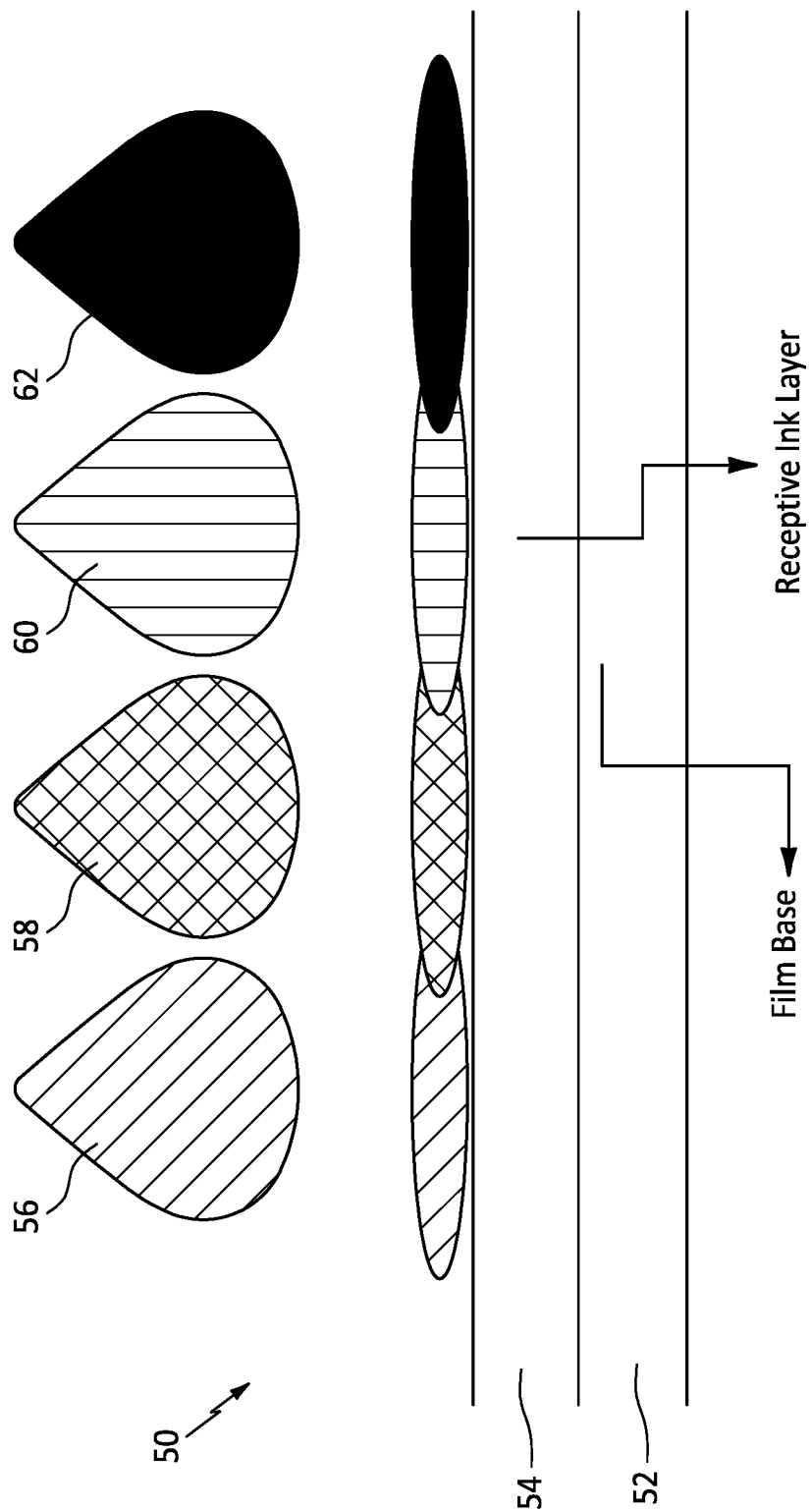
Figure 3:
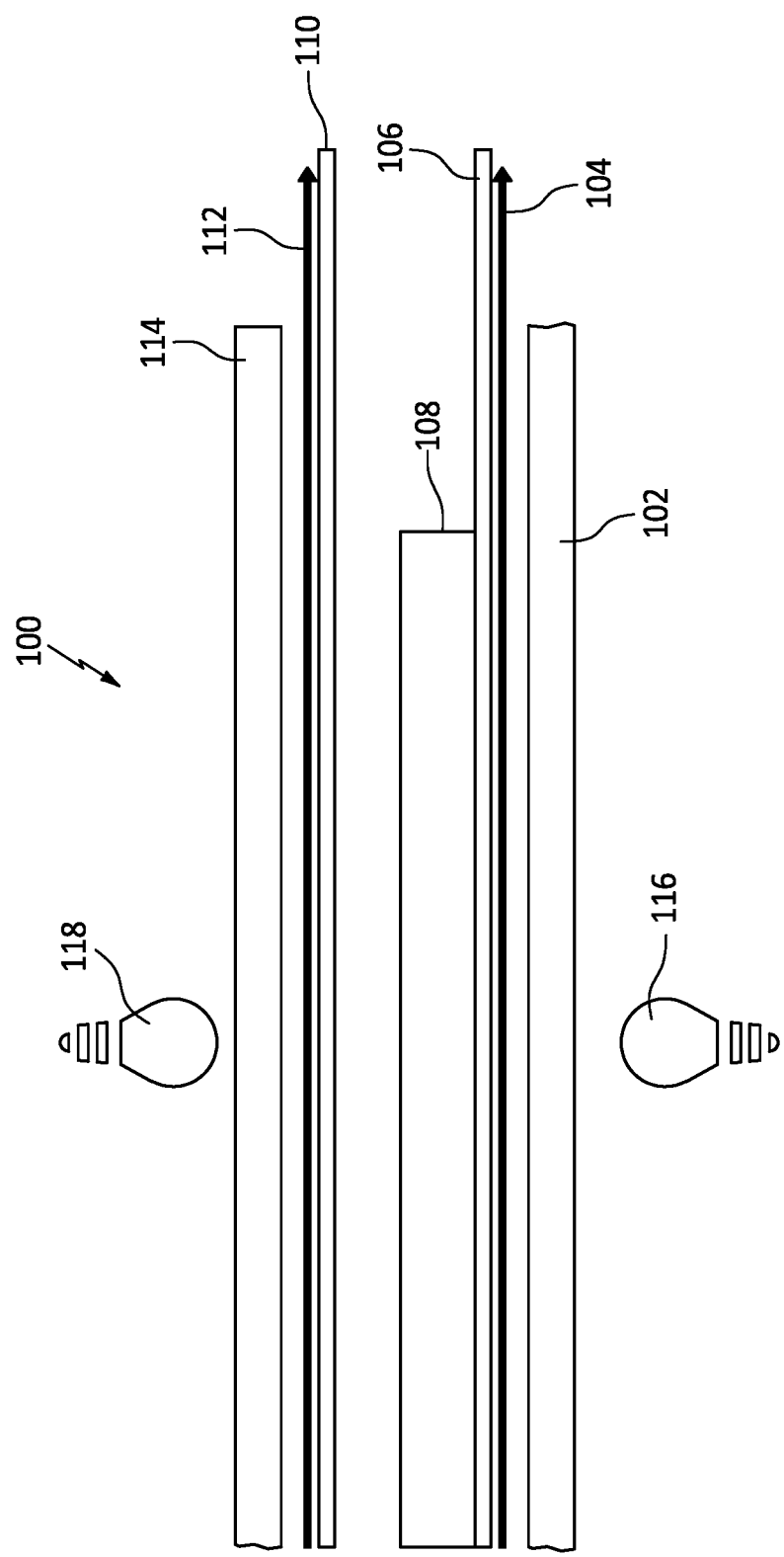
Figure 4:
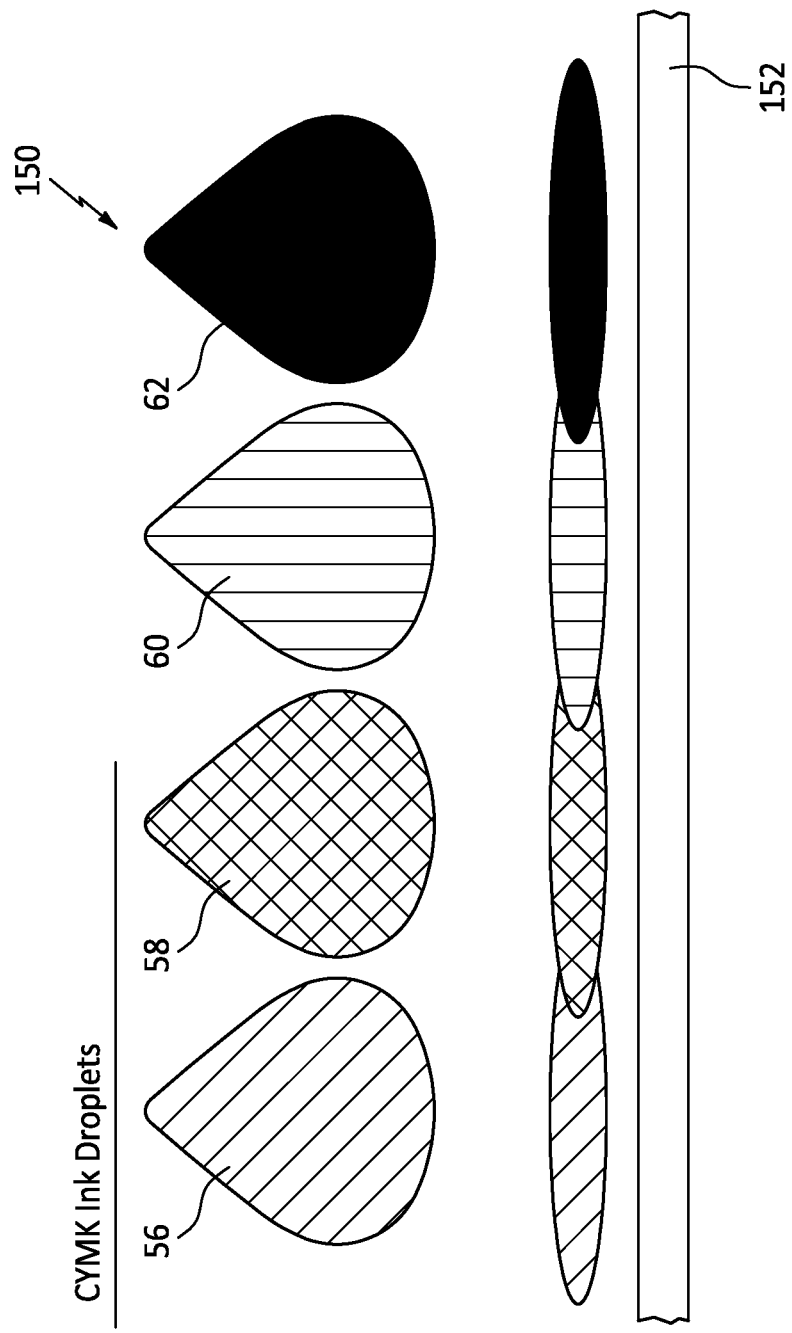

To assist those of ordinary skill in the art in making and using the disclosed assemblies, systems and methods, reference is made to the appended figures, wherein:

FIG. 1 schematically depicts a conventional liquid photopolymer platemaking process according to the prior art;

FIG. 2 schematically depicts a conventional inkjet film technology according to the prior art;

FIG. 3 schematically depicts an analog platemaking process with a UV polymer layer mask according to the present disclosure; and FIG. 4 schematically depicts a UV inkjet film technology according to the present disclosure.

Also, while not all elements may be labeled in each figure, all elements with the same reference number indicate similar or identical parts.

DETAILED DESCRIPTION OF THE INVENTION

The present invention provides methods for preparing a film negative or other mask layer, preferably for use in a liquid platemaking process, wherein the process of preparing the resulting UV-printed polymer layer eliminates the need for the film substrate to be inkjet-receptive or modified to be inkjet-receptive. The resulting UV-printed polymer layer can be used as a film negative or other mask layer during a liquid platemaking processes.

The present invention produces a film negative or other mask layer that includes an improved UV-printed polymer layer that includes surface morphology configured to improve air removal under vacuum during the subsequent imaging process.

As used herein, "a," "an," and "the" refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath," "below," "lower," "above," "upper," "front," "back," and the like, are used for ease of description to describe one element or feature's relationship to another element(s) or feature(s). It is further understood that the terms "front" and "back" are not intended to be limiting and are intended to be interchangeable where appropriate.

As used herein, the terms "comprise(s)" and/or "comprising," specify the presence of stated features, integers, steps, operations, elements, and/or components, but do not preclude the presence or addition of one or more other features, integers, steps, operations, elements, components, and/or groups thereof.

As used herein, the terms "printed polymer layer" and "UV printed polymer layer" may refer to an image negative, a backmask, and the like.

As used herein, the term "substantially-free" or "essentially-free" if not otherwise defined herein for a particular element or compound means that a given element or compound is not detectable by ordinary analytical means that are well known to those skilled in the art of flexographic printing.

As used herein, the term "substantially planar" refers to a substrate or component being generally on the same plane, unless otherwise defined herein.

Referring to the figures, FIG. 1 depicts a conventional liquid photopolymer platemaking system of the prior art and FIG. 2 depicts a conventional inkjet film technology of the prior art. As shown in FIG. 1, a conventional liquid photopolymer plate system 10 including several layers in a stacked configuration. The layers, each positioned on the layer therebefore, include a lower glass platen 12, an imaging film layer 14, a coverfilm layer 16, a liquid photopolymer layer 18 that has been cast onto or otherwise disposed on the coverfilm layer 16, a carrier sheet/basefilm layer 20, backmask film layer 22, and an upper glass platen 24. A lower UV lamp 26 is positioned below the lower glass platen 12 and an upper UV lamp 28 is positioned above the upper glass platen 24 such that the UV lamps 26, 28 project light towards upper and lower surfaces of the liquid photopolymer layer 18.

As shown in FIG. 2, a conventional inkjet film process 50 requires a receptive ink layer 54 to be placed in contact with a film base 52 in order to create an acceptably detailed image when using UV ink 56, 58, 60, 62. UV ink colors including cyan 56 (depicted with diagonal lines), magenta 58 (depicted with diagonal crosshatching lines), yellow 60 (depicted with vertical lines), and black 62 (depicted as a solid color) can be used to create the detailed image. An example of this conventional process is described in U.S. Pat. No. 9,726,971 to Maneira, the subject matter of which is herein incorporated by reference in its entirety. The disclosed UV printed polymer layer (e.g., UV printed polymer layer mask) with the desired UV light blocking density can be utilized in the manufacture or imaging of liquid flexographic printing plates.

FIG. 3 depicts a platemaking process in accordance with the present invention that utilizes a UV polymer layer mask 100 prepared in accordance with the method as further described herein.

A liquid plate making process in accordance with the present invention includes the use of the UV polymer layer mask and includes the following layers, each positioned on the layer therebefore: a lower glass platen 102, an imaging film 104, a coverfilm layer 106, a liquid photopolymer layer 108, a carrier sheet/basefilm layer 110, a UV polymer layer mask layer 112, and an upper glass platen 114. A lower UV lamp 116 is positionable below the lower glass platen 102 and an upper UV lamp 118 is positionable above the upper glass platen 114 so that the UV lamps 116, 118 project light towards the liquid photopolymer layer 108.

As shown in FIG. 4 and in contrast to the prior art process illustrated in FIG. 2, the UV inkjet film system 150 describes herein applies UV ink 56, 58, 60, 62 directly to an inkjet printing substrate 152. That is, the inkjet printing substrate 152 does not contain an ink-receptive layer and is not modified to be ink-receptive. UV ink colors including cyan 56 (depicted with diagonal lines), magenta 58 (depicted with diagonal crosshatching lines), yellow 60 (depicted with vertical lines), and black 62 (depicted as a solid color). In contrast to the methods of the prior art, the film base of the present invention is free of and does not require any ink-receptive layer or modification to the film base that would render the inkjet printing substrate ink-receptive.

The UV inkjet printing process described herein includes an inkjet printing substrate (e.g., film base) 152 that is a non-absorbent, transparent substrate to print UV ink thereon, which may be four-color 56, 58, 60, 62 or single color.

In another preferred embodiment, a single color is ink is used, which is most preferably and most typically black. This eliminates the need to use cyan, magenta, and yellow inks and makes the process more effective. However, other single color inks would also be usable in the practice of the instant invention and would be known to those skilled in the art.

The inventors of the present invention have found that by installing black inks across all of the deferent color channels of the printheads, equipment maintenance and calibrations are reduced, minimizing ink consumption while increasing equipment output speeds. Thus, instead of using a typical four-color system, black ink is used for preparing the film negative. This also results in the lowest ink consumption possible, making the process more efficient and cost-effective.

The inkjet printing substrate is positioned in contact with a substantially planar transparent support surface (e.g., glass surface) configured to allow light exposure (e.g., UV light exposure) therethrough. In one embodiment, air trapped between the inkjet printing substrate and the support surface is removed to eliminate or at least reduce wrinkling of the inkjet printing substrate. The removal of trapped air, often by vacuum, is preferably performed prior to printing the UV ink on the inkjet printing substrate. Thereafter, the UV ink is printed onto the inkjet printing substrate consistent in a desired pattern, which desired pattern may be a series of printing dots or other printing features or islands.

The UV ink is ejected from a UV inkjet print head, which is configured to receive (i.e., is in communication with) a computer-generated image. Then, the UV ink is exposed to actinic radiation from at least one UV light, wherein the at least one UV light is disposed in an exposure unit. The at least one UV light may be positioned below the glass surface, above the glass surface, and/or at a position therebetween. In one embodiment, a second UV light is positioned opposite the first UV light. Exposure of the UV ink to the UV light promotes crosslinking and curing of the UV ink to create the negative or mask layer on the inkjet printing substrate, producing a UV printed polymer layer in the desired pattern.

The inkjet printing substrate may comprise any transparent plastic material that does not contain any UV blocker or inhibitor. Preferably, the inkjet printing substrate is not inkjet-receptive and/or is not modified to be inkjet-receptive, and more preferably the inkjet printing substrate does not contain an inkjet receptive layer and is not modified to be inkjet receptive. In one embodiment, the inkjet printing substrate is a transparent material selected from the group consisting of polyethylene terephthalate (PET), polycarbonate (PC), and polyethylene naphthalate (PEN).

In one embodiment, the inkjet printing substrate does not contain an adhesive or an ink-receptive layer. Therefore, in one preferred embodiment, the UV ink is printed directly onto the inkjet printing substrate and the UV ink is printed directly onto a surface of the inkjet printing substrate with no adhesive disposed thereon.

In another embodiment, the inkjet printing substrate contains an adhesive layer and does not contain an ink-receptive layer. Based thereon, the inkjet printing substrate contains an adhesive layer with a release liner, and the adhesive layer is disposed on a surface of the inkjet printing substrate.

In one embodiment, the inkjet printing substrate is a multi-layer structure that includes a pressure sensitive adhesive liner integral to the substrate and a release liner to be printed mounted thereon. During the platemaking process, the pressure sensitive adhesive liner is typically applied to the back of finished printing plates in order to adhere the plates to the press mount. The process described herein eliminates the need for this additional step and the labor required to adhere the pressure sensitive adhesive layer to the printing plate. Thus, the release liner is the surface on which the UV ink is printed, which release liner is a thin polyester or polyethylene terephthalate film that protects the pressure sensitive adhesive. The UV ink may printed onto the separate print liner disposed on the release liner of the adhesive layer.

The inkjet printing substrate described in the present invention is configured to work with a variety of UV inks, which UV inks include one or more photoinitiators, monomers, and binders. The UV inks usable in the practice of the instant invention are those UV inks that are at least substantially solvent-free. As used herein, the term "solvent-free" refers to a UV ink that contains solvent in detectable limits of less than 1% by weight, preferably in detectable limits of less than 0.1% by weight.

The one or more UV inks may be selected from the group including SPC-0371, F-200, LH-100, MUH-100-Si, LF-140, LF-200, LUS-120, LU-125, LUS-150, LUS-170, LUS-175, LUS-200, LUS-350, MH-100, PR-100, PR-200, SW-100, each manufactured by Mimaki® Engineering Co., Ltd (Nagano, Japan), by way of example and not limitation. Other solvent-free UV inks would also be known to those skilled in the art and would be usable in the present invention. In a preferred embodiment, the solvent-free UV ink is sufficiently opaque so as to limit (or prevent) UV curing of the portions of unexposed photopolymers covered by the masking portions of the film negative during the manufacturing of analog liquid flexographic printing plates. Suitable black inks for use in a single color system include the UV inks listed above.

The process of making the UV printed polymer layer of the present invention generally includes the steps of:
(1) providing an inkjet printing substrate, wherein the inkjet printing substrate does not contain an ink-receptive layer and/or wherein the inkjet printing substrate is not modified to be ink-receptive;
(2) printing a UV ink on the inkjet printing substrate in a desired pattern, wherein the UV ink is at least substantially solvent-free; and
(3) curing the UV printed ink by exposing the UV ink to a source of UV light.

In one embodiment, the source of UV light may include at least one UV light configured to produce a wavelength output in the range of about 365 nm to about 405 nm. In one embodiment, the source of UV light is mounted so that it is scannable across the width of the inkjet printed substrate.

In one embodiment, the inkjet printing substrate moves relative to the inkjet printer to selectively crosslink and cure the UV ink dispensed thereon. In a preferred embodiment, the inkjet printing substrate is advanced through the inkjet printer to print the UV ink on the inkjet printing substrate in a desired pattern, which desired pattern is generally a series of printing dots, printing features and/or islands. The inkjet printer may also include the source of UV light mounted therein to immediately crosslink and cure the UV ink at least substantially simultaneously as the inkjet printing substrate is advanced through the inkjet printer, which helps to eliminate the need for additional coatings. Other configurations would also be known to those skilled in the art.

In the embodiment of an all-black ink delivery configuration, the inventors have discovered that it is possible to increase equipment reliability and with quicker technical response support by remotely redirecting malfunctioning nozzles or channels. The use of black ink ensures that all ink bay consummation is equal across all channels and nozzles, eliminating uneven ink volume usage in each respective channel as may occur in four-color configurations.

Due to the pigment load of black inks, both UV and transmissive light blocking is achieved with minimum ink consumption during liquid photopolymer plate exposure. Furthermore, by ensuring minimum light transmissive, light refraction between the different light waves is minimizes, providing the highest exposure fidelity.

In one preferred embodiment, photopolymer crosslinking can be achieved with light transmission below 2.0 as measured using a transmission densitometer (such as X-Rite 361T or Macbeth Td-929 Photo Graphic Color Densitometer) for either a single color or a four-color system.

The curing time of the UV ink may be dependent on and coordinated with other parameters, including for example, printing speed, layer disposition and surface morphology requirements. The printing speed and exposure duration facilitate curing of the UV ink (e.g., cured to the touch). In some instances, the curing time of the polymer layer UV ink may be accomplished by advancing the UV ink printed substrate relative to the source of UV light at a speed of between about 16 inches per minute to about 3 inches per minute. The curing of the UV ink may occur at a temperature in the range of about 60° F. to about 90° F. Specifically, UV ink curing may occur in the temperature range of about 70° F. to about 80° F. More preferably, UV curing may take place at room temperature. However, it is appreciated that "room temperature" may be subjective based on the individual, season, and/or country, and thus, the present disclosure does not seek to limit to a single interpretation of "room temperature". Nonetheless, it is appreciated that curing performed at room temperature does not require additional localized heat to achieve good adhesion between the UV ink and the substrate, which is a common shortcoming of present UV ink curing methods.

In contrast to the film negatives made by the process of the present invention, the UV inks of the prior art are solvent-based inks that require additional steps of heating and drying to produce the film negative. In this instance, insufficient heat can cause smearing and transfer of the mask, causing production difficulties. On the other hand, too much heat and the substrate can be distorted, causing registration issues with the imaging film. Thus, in a preferred embodiment, the present invention does not require any heating or drying step to produce the film negative of the invention.

In some embodiments, the disclosed UV printed polymer layer may be utilized during exposure of the "floor." For example, to produce a floor that resembles the desired pattern but is dimensioned slightly larger. For example, the floor resembling the desired pattern may be dimensioned about one-quarter to about one-half inch greater than the desired pattern. This method of printing plates is commonly referred to as "imposition plates," "island plates," or "I-plates". By utilizing this method, less liquid photopolymer is used to create the floor.

Thus, in one embodiment, the present invention relates generally to a method of preparing an I-plate using a liquid photopolymer resin, the method comprising the steps of:

(a) positioning a first film negative on a substantially planar transparent support surface, wherein the first film negative is configured in a first desired pattern;

(b) casting a layer of liquid photopolymer in direct or indirect contact with the first film negative;

(c) positioning a second film negative in alignment with and opposite the first film negative, the second film negative being in direct or indirect contact with the layer of liquid photopolymer, wherein the second film negative is configured to have a second desired pattern in alignment with the first desired pattern; and (d) exposing actinic radiation through the first UV printed polymer layer and the second UV printed polymer layer to selectively crosslink and cure the liquid photopolymer layer in accordance with the first desired pattern and the second desired pattern, where the first and second film negatives are produced in accordance with the method described herein.

In some embodiments, the disclosed UV ink, when printed to form the UV printed polymer layer, may include surface morphology configured, in part, to improve air removal under vacuum. Particularly, the UV ink, when cured, may have a surface morphology that defines one more microchannels. The one or more microchannels may be positioned in a predetermined pattern, in a randomized pattern, or in a partially predetermined pattern and a partially randomized pattern. The disclosed air removal may promote removal of air trapped between the disclosed UV printed polymer layer and an adjacent surface through the process of mechanical vacuuming. For example, the disclosed air removal may promote removal of air trapped between the disclosed UV printed polymer layer and an upper glass. Air trapped between the disclosed UV printed polymer layer and the upper glass may cause the upper glass to wrinkle, which can negatively affect the quality of the liquid photopolymer plate.

Although the present disclosure has been described with reference to exemplary implementations, the present disclosure is not limited by or to such exemplary implementations. Rather, various modifications, refinements and/or alternative implementations may be adopted without departing from the spirit or scope of the present disclosure.

The invention claimed is:

1. A method of preparing a film negative, the method comprising the steps of:
   (a) dispersing a UV ink in a desired pattern on a UV printing substrate; and
   (b) curing the UV ink with a source of actinic radiation to crosslink and cure the UV ink and create the UV printed polymer layer in the desired pattern,
   wherein the UV ink is at least substantially solvent-free, and
   wherein the printing substrate does not contain an adhesive layer or an ink-receptive layer and has not been modified to be ink-receptive.

2. The method according to claim 1, wherein the printing substrate comprises a transparent material selected from the group consisting of polyethylene terephthalate, polycarbonate, and polyethylene naphthalate.

3. The method according to claim 1, wherein the UV ink is cured by exposure to the at least one UV light source at a wavelength output in the range of about between about 365 nm and about 405 nm.

4. The method according to claim 3, wherein the step of curing the UV printing a curing time of the UV ink is accomplished by advancing the printing substrate relative to at least one UV light source at a speed of between about 16 inches per minute and about 3 inches per minute.

5. The method according to claim 1, wherein the printing substrate contains an adhesive layer disposed on the printing substrate, wherein the adhesive layer is covered with a release liner, and wherein the UV ink is printed on a surface of the release liner.

6. The method according to claim 1, wherein the UV ink is cured at a temperature of between about 60° F. and about 90° F.

7. The method according to claim 6, wherein the UV ink is cured at a temperature of between about 70° F. and about 80° F.

8. The method according to claim 1, wherein the UV ink comprises one or more photoinitiators, monomers, and binders.

9. The method according to claim 1, wherein the UV ink comprises a four-color system comprising cyan, magenta, yellow and black.

10. The method according to claim 1, wherein the UV ink is a single color ink, wherein said single color ink is black.

11. The method according to claim I, wherein the curing of the UV ink produces a surface morphology configured to improve air removal under vacuum, wherein the surface morphology defines a microchannel.

12. The method according to 1, wherein the UV ink is not subjected to heating or drying step.

13. A film negative usable in the a process of imaging a flexographic printing element, wherein the film negative produced according to the method of claim 1.

14. A method of preparing an I-plate using a liquid photopolymer resin, the method comprising the steps of:
   (a) positioning a first film negative on a substantially planar transparent support surface, wherein the first film negative is configured in a first desired pattern;
   (b) casting a layer of liquid photopolymer in direct or indirect contact with the first film negative;
   (c) positioning a second film negative in alignment with and opposite the first film negative, the second film negative being in direct or indirect contact with the layer of liquid photopolymer, wherein the second film negative is configured to have a second desired pattern in alignment with the first desired pattern; and
   (d) exposing actinic radiation through the first UV printed polymer layer and the second UV printed polymer layer to selectively crosslink and cure the liquid photopolymer layer in accordance with the first desired pattern and the second desired pattern,
   wherein the first and second film negatives are produced in accordance with the method of claim 1.

15. The method according to claim 14, wherein the second desired pattern is dimensioned larger than the first desired pattern, thereby producing an island around the first desired pattern.

* * * * *